(12) United States Patent
Roobol et al.

(10) Patent No.: US 10,976,265 B2
(45) Date of Patent: Apr. 13, 2021

(54) OPTICAL DETECTOR

(71) Applicant: ASML Netherlands B.V., Veldhoven (NL)

(72) Inventors: Sander Bas Roobol, Veldhoven (NL); Richard Quintanilha, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 10 days.

(21) Appl. No.: 16/039,764

(22) Filed: Jul. 19, 2018

(65) Prior Publication Data
US 2019/0049393 A1   Feb. 14, 2019

(30) Foreign Application Priority Data

Aug. 14, 2017 (EP) ..................................... 17186164

(51) Int. Cl.
| | |
|---|---|
| *G01N 21/956* | (2006.01) |
| *G01N 21/47* | (2006.01) |
| *G03F 7/20* | (2006.01) |
| *G03F 9/00* | (2006.01) |
| *G01N 23/2055* | (2018.01) |

(52) U.S. Cl.
CPC ....... *G01N 21/956* (2013.01); *G01N 21/4788* (2013.01); *G01N 23/2055* (2013.01); *G03F 7/7085* (2013.01); *G03F 7/70191* (2013.01); *G03F 7/70291* (2013.01); *G03F 7/70575* (2013.01); *G03F 9/7088* (2013.01);
(Continued)

(58) Field of Classification Search
CPC .... G01N 21/956; G01N 15/0211; G03F 7/70; G02B 5/288
See application file for complete search history.

(56) References Cited

U.S. PATENT DOCUMENTS

| 5,229,872 A | 7/1993 | Mumola |
|---|---|---|
| 5,296,891 A | 3/1994 | Vogt et al. |

(Continued)

FOREIGN PATENT DOCUMENTS

| CN | 102099747 A | 6/2011 |
|---|---|---|
| EP | 0 798 585 A2 | 10/1997 |

(Continued)

OTHER PUBLICATIONS

Intenational Search Report and Written Opinion of the International Searching Authority directed to related International Patent Application No. PCT/EP2018/067903, dated Oct. 12, 2018; 10 pages.

*Primary Examiner* — Rebecca C Bryant
(74) *Attorney, Agent, or Firm* — Sterne, Kessler, Goldstein & Fox P.L.L.C.

(57) ABSTRACT

A detector for detecting diffracted radiation which has been diffracted by a regular structure; said detector comprises: a sensor for sensing at least a portion of said diffracted radiation, said sensor having a first region and a second region; a first coating configured to allow transmission of radiation with wavelengths within a first range of wavelengths; and a second coating configured to allow transmission of radiation with wavelengths within a second range of wavelengths; wherein said first coating coats said first region of said sensor, and said second coating coats said second region of said sensor, and wherein said first and second regions are different regions.

20 Claims, 7 Drawing Sheets

(52) U.S. Cl.
CPC .............. *G01N 2021/95676* (2013.01); *G01N 2201/06113* (2013.01)

(56) References Cited

U.S. PATENT DOCUMENTS

| | | |
|---|---|---|
| 5,523,193 A | 6/1996 | Nelson |
| 5,748,365 A * | 5/1998 | Chen ...................... G02B 13/22 359/366 |
| 6,952,253 B2 | 10/2005 | Lof et al. |
| 9,529,283 B2 * | 12/2016 | Yakunin ................. B82Y 10/00 |
| 2002/0140930 A1 * | 10/2002 | Lin .................... G01N 21/9501 356/237.2 |
| 2007/0216785 A1 | 9/2007 | Nomura et al. |
| 2009/0020703 A1 * | 1/2009 | Buckley .................... G01J 5/04 250/338.3 |
| 2012/0235049 A1 | 9/2012 | Wang |
| 2013/0141730 A1 | 6/2013 | Quintanilha |
| 2017/0031246 A1 | 2/2017 | Den Boef |

FOREIGN PATENT DOCUMENTS

| | | |
|---|---|---|
| JP | 2002-077914 A | 3/2002 |
| TW | 201716742 A | 5/2017 |
| WO | WO 99-49504 A1 | 9/1999 |
| WO | 2014/143338 A2 * | 9/2014 |

\* cited by examiner

OPTICAL DETECTOR

TECHNICAL FIELD

The invention relates to optical detectors, in particular the invention may relate to optical detectors for detecting diffracted radiation.

BACKGROUND

A lithographic apparatus is a machine that applies a desired pattern onto a target portion of the substrate. A lithographic apparatus can be used, for example, in the manufacture of logic and/or memory chips, termed integrated circuits (ICs) herein. In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. These target portions are commonly referred to as "fields".

In lithographic processes, it is desirable frequently to make measurements of the structures created, e.g., for process control and verification. This may be termed metrology. Various tools for making such measurements are known, including scanning electron microscopes (SEMs), which are often used to measure critical dimension (CD), and specialized tools to measure overlay, the accuracy of alignment of two layers in a device. Recently, various forms of optical tools or scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a measurement signal from which a property of interest of the target can be determined.

At the same time, known inspection techniques employ radiation in the visible or ultraviolet waveband (e.g. greater than 200 nm). This limits the smallest features that can be measured, so that the technique can no longer measure directly the smallest features made in modern lithographic processes. To allow measurement of smaller structures, it has been proposed to use radiation of shorter wavelengths similar, for example, to the extreme ultraviolet (EUV) wavelengths used in EUV lithography. Such wavelengths may be in the range 1 to 100 nm, for example, or 1 to 125 nm. Part or all of this wavelength range may also be referred to as soft x-ray (SXR) wavelengths. Some authors may use SXR to refer to a narrower range of wavelengths, for example in the range 5-50 nm or 10-20 nm. For the purposes of the methods and apparatus disclosed herein, these terms SXR and EUV will be used without implying any hard distinction. Metrology using harder x-rays, for example in the range 0.1-1 nm is also contemplated.

Broadband soft x-ray light can be used for scatterometry as well. Short wavelength radiation is used to illuminate a target, and the scattered light (diffraction pattern) is captured. In addition, the $0^{th}$ order reflected beam is sent into a spectrometer. The diffraction pattern and the $0^{th}$ order signal is used to obtain a parameter of interest (CD, OVL, etc) for example using a reconstruction algorithm.

Compact sources of SXR radiation include HHG sources, in which infrared pump radiation from a laser is converted to shorter wavelength radiation by interaction with a gaseous medium. HHG sources are available for example from KMLabs, Boulder Colo., USA (http://www.kmlabs.com/).

Since the SXR photons of interest have a very short penetration depth in any medium, the gaseous medium may take the form of a gas jet located in a low-pressure (near vacuum) environment. The gas jet may be freely ejected from a nozzle, or confined within a waveguide structure that prolongs its interaction with the pump radiation.

FIG. 1 shows a block schematic sketch of an apparatus 100 for use as an HHG source 100. The apparatus 100 comprises a pulsed high power infrared or optical laser 102, a chamber 104 comprising a radiation input 106 and a radiation output 108, and a vacuum optical system 110. The laser 102 emits driving radiation, which enters the chamber 104 through the radiation input 106 and is incident on a gas target 112 located at an interaction region 114 within the chamber 104. The gas target 112 comprises a small volume (typically several cubic mm) of a particular gas (e.g., a noble gas, nitrogen, oxygen or carbon dioxide). Other media, such as metallic plasmas (e.g. aluminium plasma) may be used.

Due to interaction of the driving radiation emitted by the laser 102 with the gas atoms of the gas target 112, the gas target 112 will convert part of the driving radiation into emitted radiation, which in this case comprises radiation at a plurality of wavelengths in the range from 1 nm to 100 nm (termed SXR herein). The emitted radiation typically consists of odd harmonics of the drive laser, i.e. the frequencies are an odd multiple of the drive laser frequency. This so-called "high harmonic" radiation is emitted in a direction collinear with the incident driving radiation.

The SXR beam passes through the radiation output 108 and is subsequently manipulated and directed to a wafer to be inspected by the vacuum optical system 110.

Because air (and in fact any gas) heavily absorbs SXR radiation, the volume between the gas target and the wafer to be inspected is evacuated or nearly evacuated. The driving radiation is directed into the chamber 104 through the radiation input 106, which is a viewport typically made of fused silica or a comparable material. Since the driving radiation and the emitted radiation (SXR beam) are collinear, the driving radiation typically needs to be blocked to prevent it passing through the radiation output 108 and entering the vacuum optical system 110. This is typically done by incorporating a filter into the radiation output 108, which is placed in the emitted beam path and that is opaque to the driving radiation (e.g. opaque to infrared or visible light) but at least partially transparent to the emitted radiation beam. The filter may be manufactured using zirconium or aluminium.

In known HHG sources, a significant proportion of the emitted radiation beam is absorbed by the laser blocking filter used at the radiation output 108 to block the driving radiation. This leads to a loss of emitted radiation output power of typically 50%.

Current state of the art IR blocking schemes rely on the transmission filter to suppress IR by ~6 orders of magnitude, typically in combination with another element (pinhole or reflective filter) that takes the bulk of the heatload away first (and adds a few more orders of magnitude of suppression). Zirconium (Zr) is a typical choice as it has a transmission window from about 6-19 nm. Aluminium (Al) is another common choice, which transmits about 20-70 nm. These filters are ultrathin, freestanding metal films, ~100-500 nm thick. The transmission filter is placed upstream, close to the source, hence it limits the wavelength range of the entire tool to one of those transmission windows. In order to perform metrology on targets with very small pitches (e.g. smaller than 20 nm), in practice wavelengths below 20 nm are required to get diffraction orders at convenient incidence and diffraction angles. Hence Zr has to be used for filtering, which limits the tool to 6-19 nm wavelength.

SUMMARY OF INVENTION

It is an objective of the invention to provide an improved detector which avoids the need for freestanding ultrathin metal films.

The invention provides a detector, a method of detecting radiation, a spectrometer and a metrology apparatus, as set out in the accompanying claims.

Preferred embodiments of the invention will now be described, by way of example only, with reference to the accompanying drawings.

DESCRIPTION OF PREFERRED EMBODIMENTS

Figure 2:
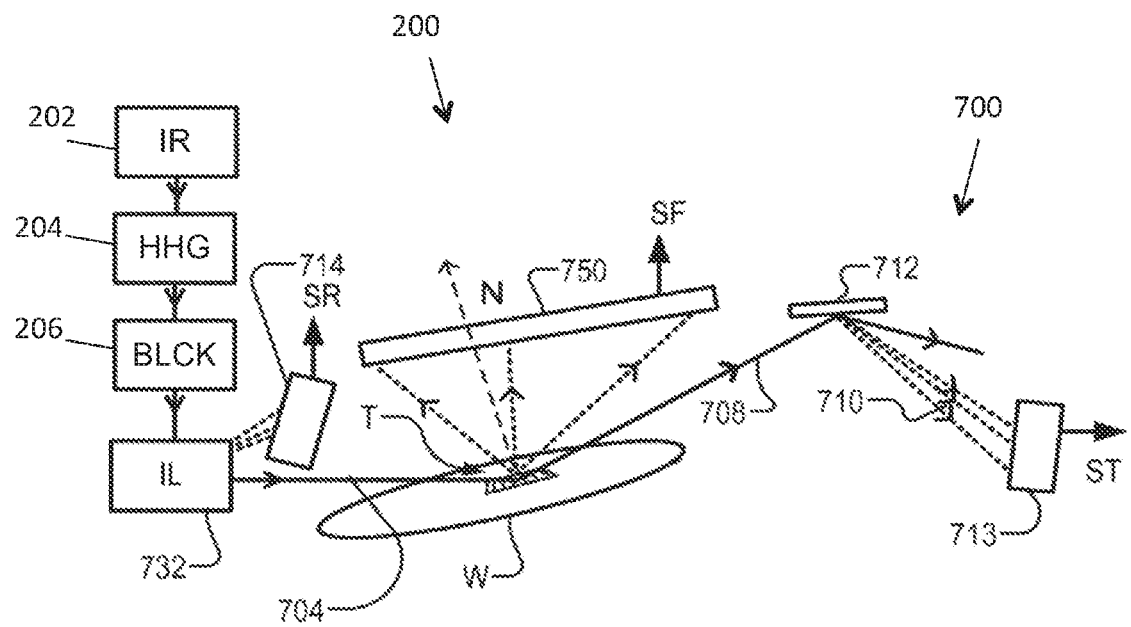
FIG. 2 is a schematic diagram of a metrology apparatus for performing metrology using SXR radiation.

FIG. 2 shows a SXR metrology apparatus 200. An IR laser 202 seeds the HHG mechanism 204 as described above. An IR filter 206 in the beam path blocks a substantial portion of the IR drive beam.

An illumination sub-system 732 illuminates (704) a target T on a wafer W and the illumination sub-system 732 may comprise a spectrometer that includes sensor 714 (which may have spatially separated coatings in accordance the disclosure of this document).

Some or all of the apparatus 200 may be evacuated, and the evacuated region may include the wafer W.

A spectrometer 700 comprises a grating 712 and a sensor 713, which may have spatially separated coatings in accordance with the disclosure of this document. The spectrometer 700 is used to measure the spectrum of the $0^{th}$ order. The −1, +1 orders that are scattered by the target T and optionally also higher orders (such as −2 and +2 orders) may impinge on a detector/sensor 750 which may have spatially separated coatings in accordance with the disclosure of this document.

The diffraction grating 712 splits reflected rays 708 into a spectrum 710 of different wavelengths. The reflection spectrum 710 is captured by detector 713 and signals ST are provided to a processor (not shown).

Signals SF produced by detector 750 can be supplied to processor (not shown) for use (together with signals SR and ST), in calculating an improved measurement of a property of interest of the target T.

It is proposed to avoid freestanding ultrathin metal films, and instead coat at least one detector with an appropriate material. Spatially separated coatings may be used, and a Zr coating may be used to allow full 6-19 nm detection.

Radiation diffracted by a regular structure will have a diffraction angle $\theta_m$ depending on the diffraction order m, the pitch of the regular structure d, and the wavelength λ (or frequency f) of the radiation. The relationship between the angle of incidence $\theta_i$ and the angle of the diffracted beam $\theta_m$ is given by $$\sin(\theta_m) = \sin(\theta_i) + \frac{m\lambda}{d}. \qquad (1)$$

Figure 9:
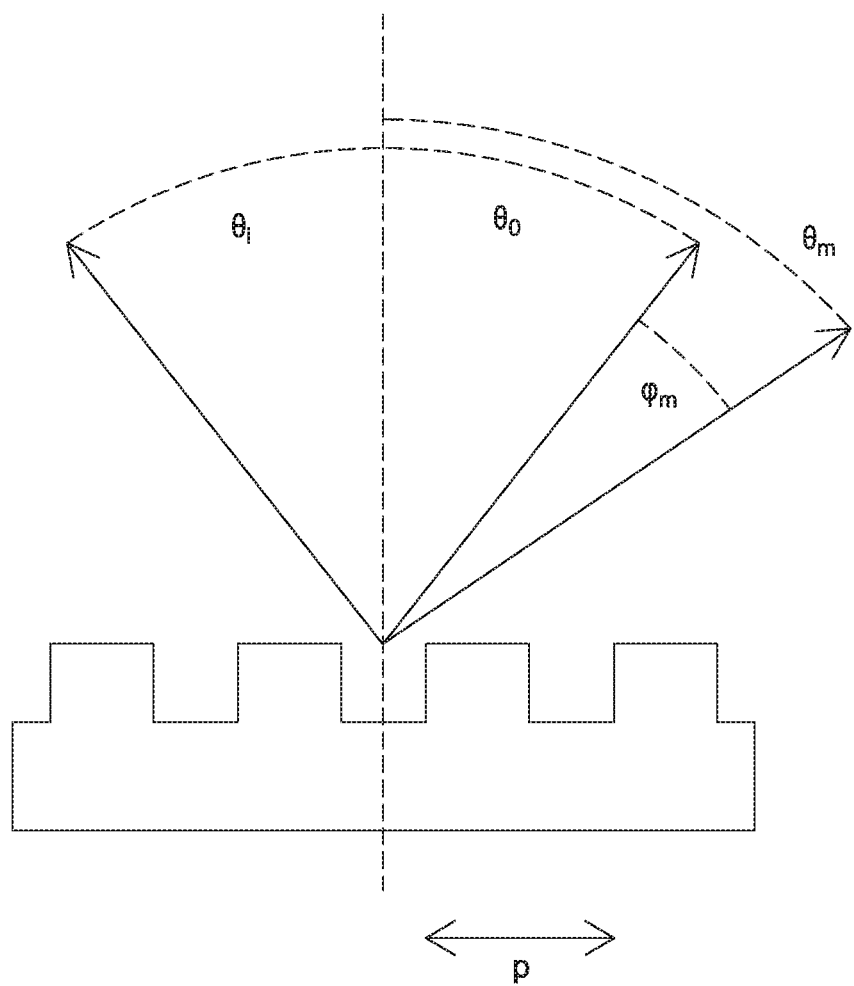
FIG. 9 shows the angles involved in diffraction from a grating.

FIG. 9 shows the angles involved in diffraction from a grating. In FIG. 9 the following variables are shown:
  angle of incidence θi
  angle of diffracted beam θm
diffraction angle φm
  (i.e. θm=θi+φm=θ0+φm)
  diffraction order m
  wavelength λ
  periodicity d It should be noted that as a result of equation (1), there are multiple combinations of wavelength and diffraction order that lead to a certain diffraction angle. The defining metric for this is the product m*λ. If two diffracted rays have the same value for this product, they will diffract under the same angle and arrive at the same position on the detector. This overlap is undesirable, since it cannot be determined if a certain amount of intensity is originating from one combination of wavelength and diffraction order or another.

Figure 3:
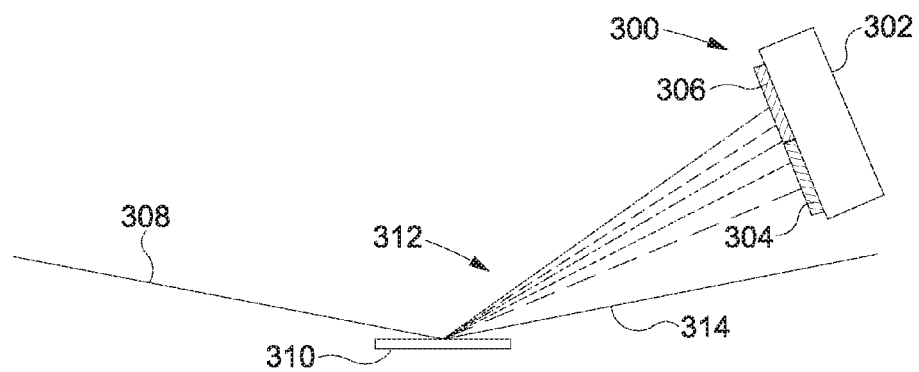
FIG. 3 is schematic diagram of a detector according to an embodiment of the invention.

FIG. 3 shows a schematic diagram of an embodiment of a detector 300. The detector comprises a sensor 302 for sensing radiation, and two coatings 304, 306 for filtering the radiation before reaching the sensor 302. The sensor 302 may for example be a CCD or CMOS sensor. A beam of radiation 308 (e.g. SXR radiation) comprising multiple harmonics (including the fundamental/drive frequency) is incident upon a regular structure 310 (not part of the detector). The regular structure 310 could be a diffraction grating (for example the diffraction grating 712 of FIG. 2) or a patterned substrate (for example the wafer W of FIG. 2), which scatters/diffracts the radiation. The diffracted radiation 312 is angularly separated into a diffraction pattern. The detector 300 is arranged relative to the regular structure 310 so that the $0^{th}$ order radiation 312 is not incident upon the detector 300. The $0^{th}$ order radiation 314 has the same diffraction angle regardless of the frequency of the radiation, and only depends on the angle of incidence. The detector 300 is further arranged relative to the regular structure 310 so that higher orders of diffracted radiation ($1^{st}$, $2^{nd}$, $3^{rd}$ etc.) are incident upon the detector 300. The radiation 312 is filtered by the two coatings 304, 306 before reaching the sensor 302, where the radiation is detected. The first coating 304 has a first transmission window to transmit incident radiation with wavelengths substantially only within the first transmission window. The second coating 306 has a second transmission window to transmit radiation with wavelengths substantially only within the second transmission window. The coatings 304, 306 are spatially separated and the detector 300 is arranged so that radiation with low diffraction angles (as measured from the 0th order beam) is incident upon the first coating 304, and radiation with larger diffraction angles (above some threshold) is incident upon the second coating 306.

This allows for the detection of radiation over a larger frequency band, without interference from higher diffraction orders. That is, the high frequency, high diffraction order radiation, which would normally interfere with the low frequency, low diffraction order radiation, gets blocked by the second coating 306 (Al). The high frequency, low diffraction order radiation, on the other hand, is incident upon the first coating 304 (Zr), which has a higher frequency cut-off and therefore transmits the radiation.

As an illustrative example, considering a single harmonic of the multi-frequency beam, radiation with 12 nm wavelength (i.e. high frequency/harmonic) is diffracted by the regular structure 310 into multiple diffraction orders with different diffraction angles, in accordance with equation 1. The actual number of diffraction orders depends on the pitch of the regular structure 310 and the angle of incidence. The $1^{st}$ order diffracted radiation has a first diffraction angle $\theta_1$; the $2^{nd}$ order diffracted radiation has a second (greater) diffraction angle $\theta_2$, etc. The detector 300 is arranged such that the $1^{st}$ and $2^{nd}$ diffraction orders are incident upon the first coating 304 (Zr), and all higher orders with greater diffraction angles are incident upon the second coating 306 (Al). The $1^{st}$ and $2^{nd}$ orders are transmitted through the first coating 304, as the frequency of the radiation (of this particular harmonic) is within the transmission window (6-19 nm) of the first coating 304. The higher orders, on the other hand, are blocked by the second coating 306 as the frequency is outside the transmission window (20-70 nm) of the second coating 306. However, the first diffraction order of radiation with certain longer wavelengths, for example 24 or 36 nm, will be radiating in the same direction as the higher orders from 12 nm, but will be transmitted by the second coating.

"Transmission window" refers to the range of wavelengths (or the frequency band) of radiation for which transmission is allowed. There is not necessarily a sharp cut-off of the range of allowed wavelengths, and the upper and lower bounds of the transmission window may be defined as where the intensity in the transmission spectrum drops by a certain relative amount (e.g. −3 dB). Hence, although the upper wavelength of the Zr transmission window may be specified as 19 nm, there will be some non-zero transmission of radiation with wavelengths greater than 19 nm. Therefore it can be said that Zr has a transmission spectrum that substantially only transmits radiation with wavelengths within the range of 6-19 nm.

In the embodiment that uses a HHG source and two spatially separated coatings, consisting of Zr and Al respectively, the bandwidth of the detector is approximately 44 nm with a high frequency cut-off determined by the Zr coating (approximately 6 nm).

In another embodiment at least one of the coatings consists of Zr, and in a further embodiment at least one of the coatings consists of Al.

Figure 4:
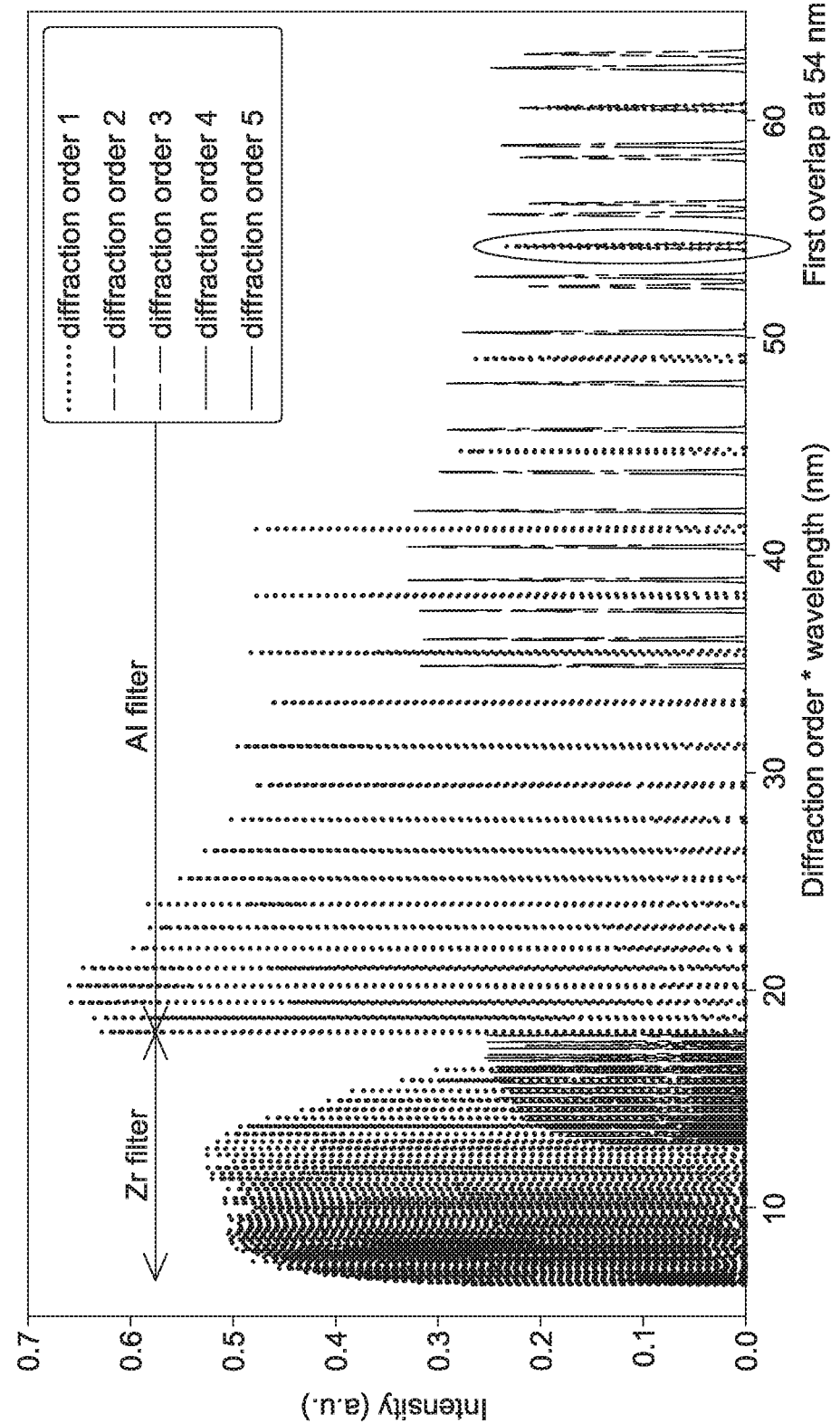
FIG. 4 is a graph showing an exemplary radiation spectrum, with the wavelength times the diffraction order plotted against the intensity.

FIG. 4 shows a graph with the diffraction order multiplied by the wavelength plotted against the intensity from an exemplary embodiment of the detector. The x-axis in this graph can also be interpreted as "diffraction angle", although a mathematically correct description would need to include the sines from formula (1) above. Hence, the coatings are positioned such that small diffraction angles may illuminate the Zr coating, and large angles may illuminate the Al coating. Because the HHG spectrum only contains odd harmonics, a $2^{nd}$ diffraction order will never overlap with a $1^{st}$ order, and the $3^{rd}$ order is the first to do so. This enables a fully usable wavelength range of approximately 6-50 nm, without overlapping diffraction orders. The first overlap is marked on the graph, and occurs at 54 nm. Overlapping orders in the reference detector need to be avoided, otherwise it is more difficult to obtain a good reference spectrum. In the $0^{th}$ order detector, overlap can potentially be dealt with in the reconstruction algorithm.

In other embodiments, more regions/coatings can be added, e.g. a 3rd material such as Sn that is transmissive from 50 nm onwards. Each coating is spatially separated so as to cover a specific range of diffraction angles, so that it is illuminated by incident radiation with diffraction angles from within this range.

In one embodiment, instead of using single layer metal coatings, it is possible to use multilayer coatings with specific properties. This enables, for example, narrowband transmission. The layers can be homogenous layers, or gradients can be applied to either the composition or to the thickness, either within in a single layer or as multilayers. Adjacent layers may also be distinguished by differences in stress and density. In other embodiments, additional layers might be added for various reasons, e.g. adhesion layers (to improve the adhesion to the substrate) or capping layers to provide protection against the environment, which could for example consist of an oxidizing or reducing low pressure atmosphere.

The detector 300, as described in any one of the embodiments, can be used as sensor 714 or sensor 713 in FIG. 2, that is as a reference detector 714 and/or a $0^{th}$ order detector 713 as a part of a spectrometer in the metrology apparatus. The spectrometer comprises the detector 300 itself and a diffraction grating 310, for diffracting a portion of the radiation towards the detector 300. The diffraction efficiency of the grating 310 should be taken in to account and can even be co-designed with the coating pattern. For example, certain diffraction orders can be suppressed for certain wavelength ranges, and this could help to improve the combined performance.

In one embodiment, the detector 300 is used as sensor 750 in FIG. 2, that is as a higher order detector 750, which is used to detect the diffracted radiation directly scattered from the target T (i.e. without the use of an intermediate diffraction grating). The structural features in the area of interest on the target T provide the regular structure which diffracts the incident radiation. However, the detector will only be optimized for a single pitch or a limited set of pitches.

Figure 5:
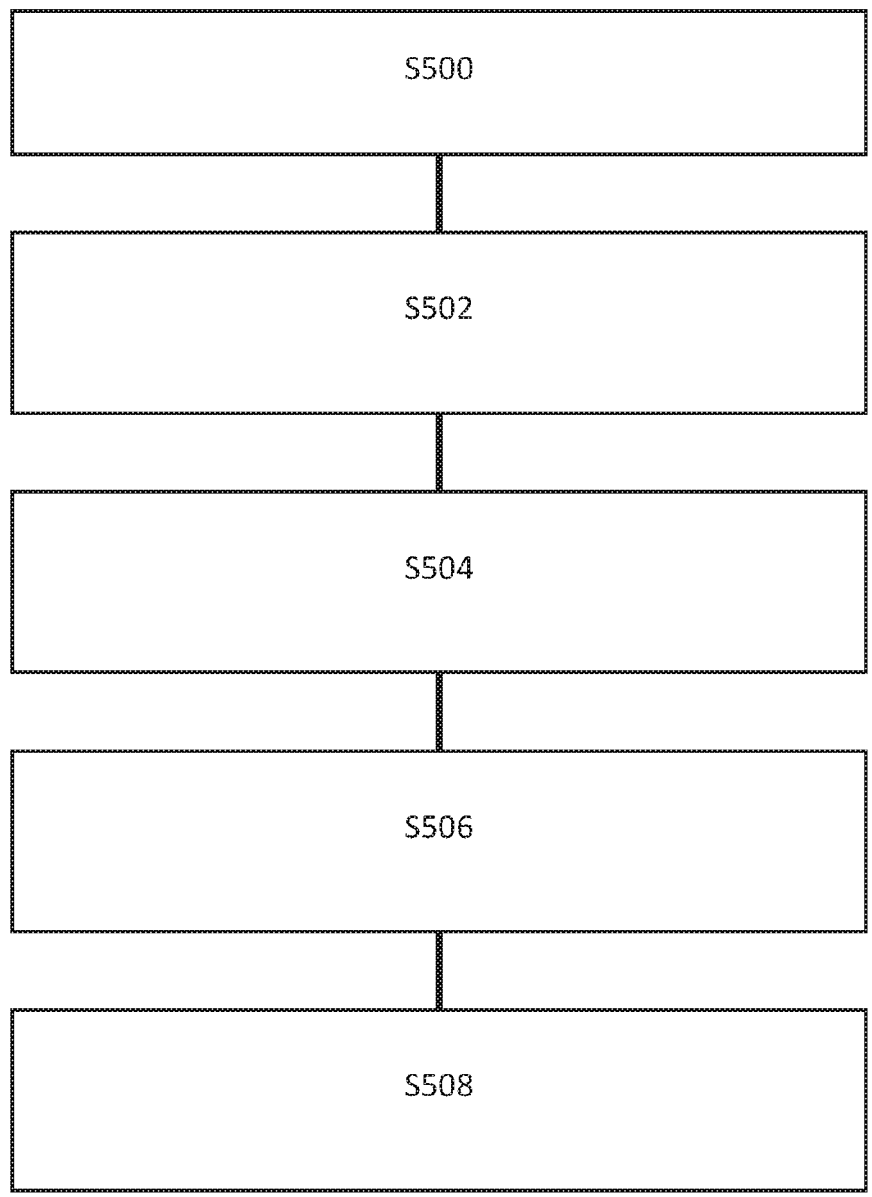
FIG. 5 is a flowchart showing the steps of a method of detecting radiation according to an embodiment of the invention.

FIG. 5 shows the steps of a method of detecting radiation according to an embodiment of this disclosure. The steps are as follows. First generate radiation S500. Diffract the radiation by a regular structure S502. Filter a first portion of the radiation diffracted by the regular structure with diffraction angles within a first range of angles through a first coating S504. Filter a second portion of the radiation diffracted by the regular structure with diffraction angles within a second range of angles through a second coating S506. Detect the radiation filtered through the first and second coatings S508.

In the above described embodiments, the radiation is produced by HHG, but the invention is not limited to HHG radiation. Although a unique feature of HHG is that $1^{st}$ and $2^{nd}$ orders do not overlap (or in general, odd and even orders), and the coatings have to be applied to suppress higher orders only. In the case of other sources (e.g. LPP/

DPP for SXR/EUV) already the $2^{nd}$ order needs to be suppressed, which can be achieved with sufficiently complex coating patterns. The concept could also be applied in visible/IR (instead of just SXR and EUV), where coatings are much easier to tune.

Figure 6:
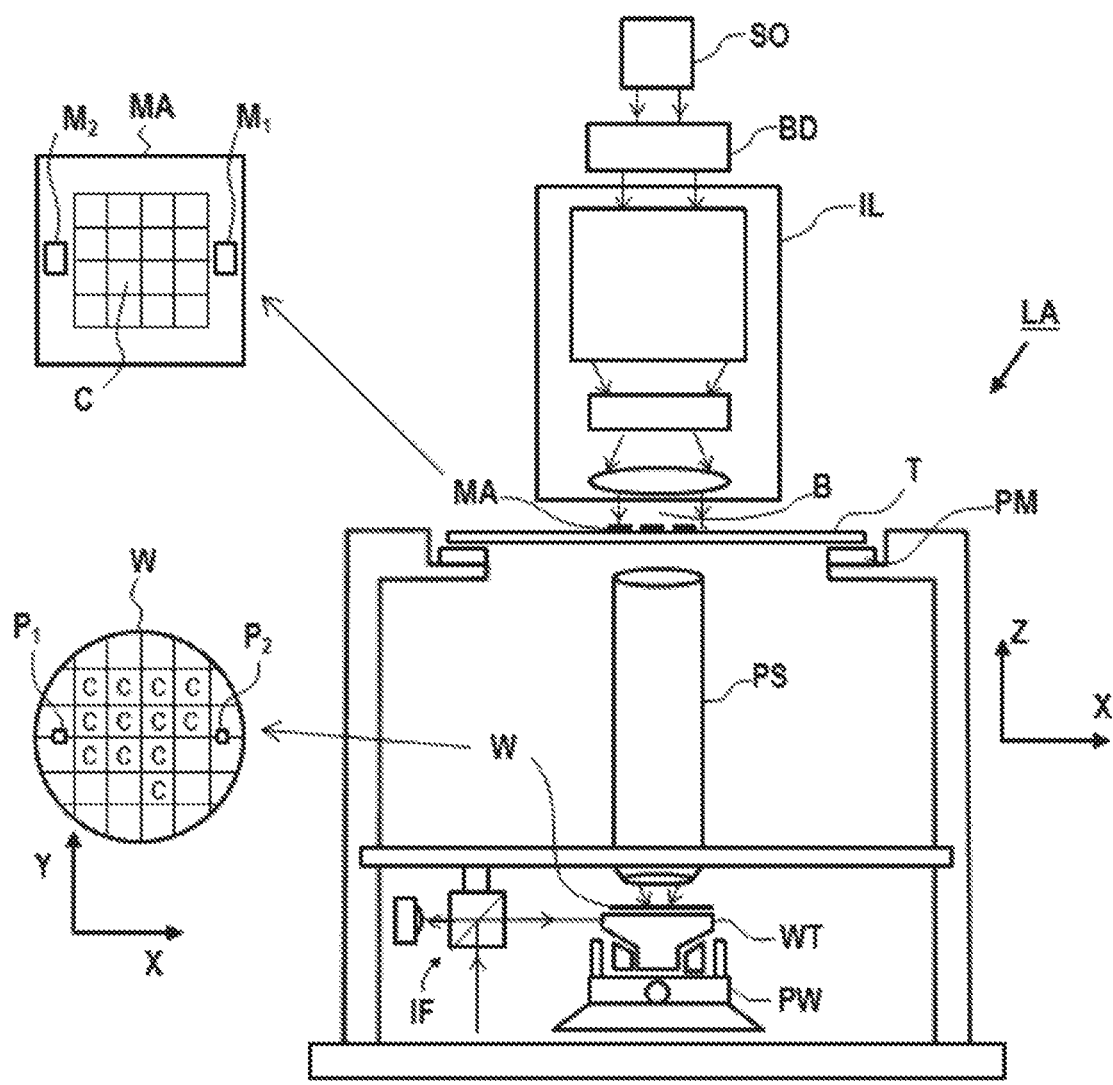
FIG. 6 depicts a schematic overview of a lithographic apparatus.
Figure 7:
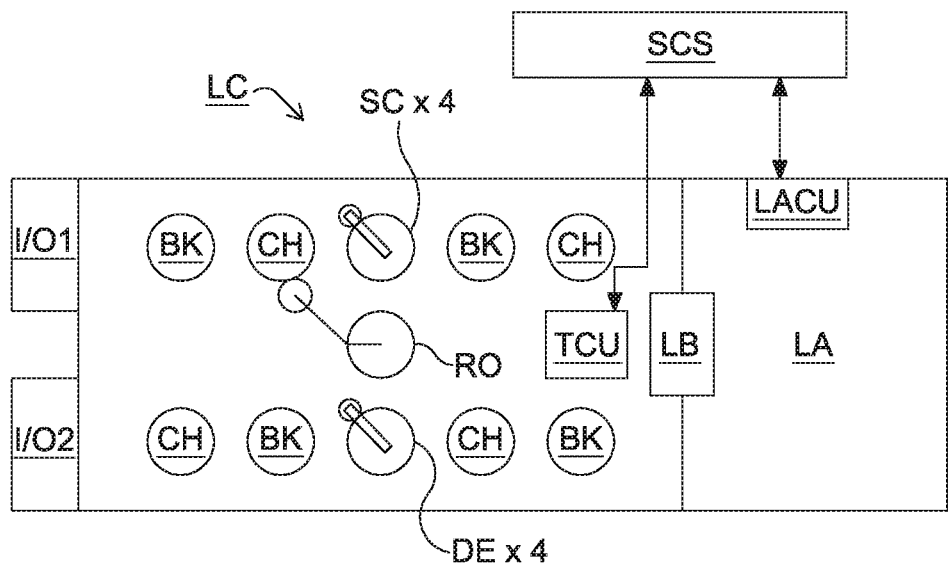
FIG. 7 depicts a schematic overview of a lithographic cell.
Figure 8:
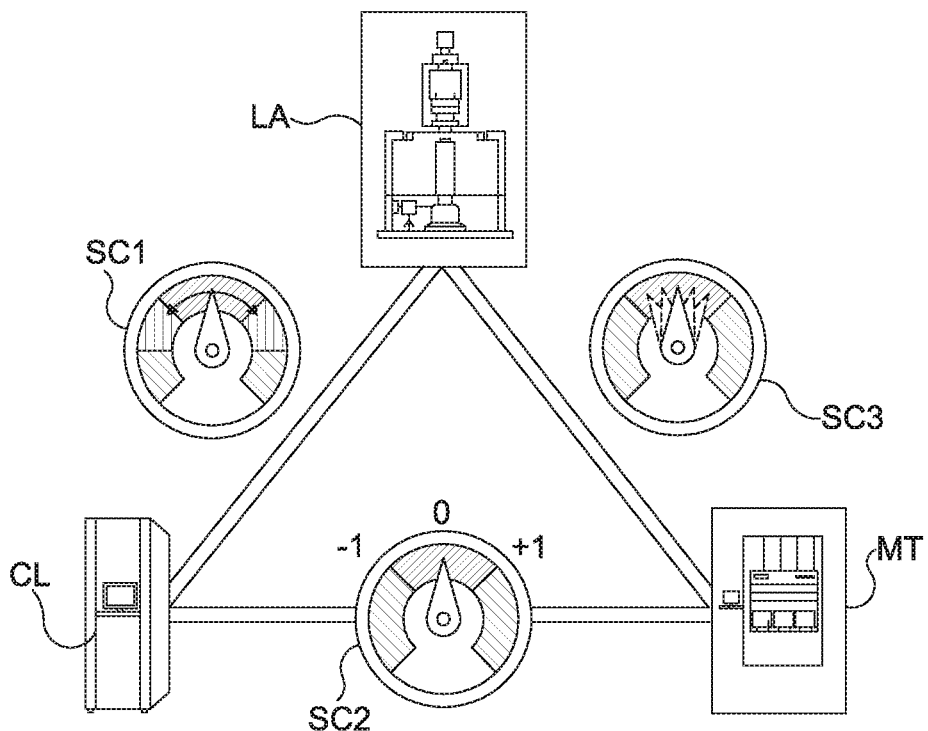
FIG. 8 depicts a schematic representation of holistic lithography, representing a cooperation between three key technologies to optimize semiconductor manufacturing.

We now describe FIGS. 6 to 8, which provide an overview of a lithographic apparatus and cell, and some key technologies used in semiconductor manufacturing.

Lithography Apparatus

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning devices include:

a programmable mirror array. More information on such mirror arrays is given in U.S. Pat. Nos. 5,296,891 and 5,523,193, which are incorporated herein by reference.

a programmable LCD array. An example of such a construction is given in U.S. Pat. No. 5,229,872, which is incorporated herein by reference.

Figure 1:
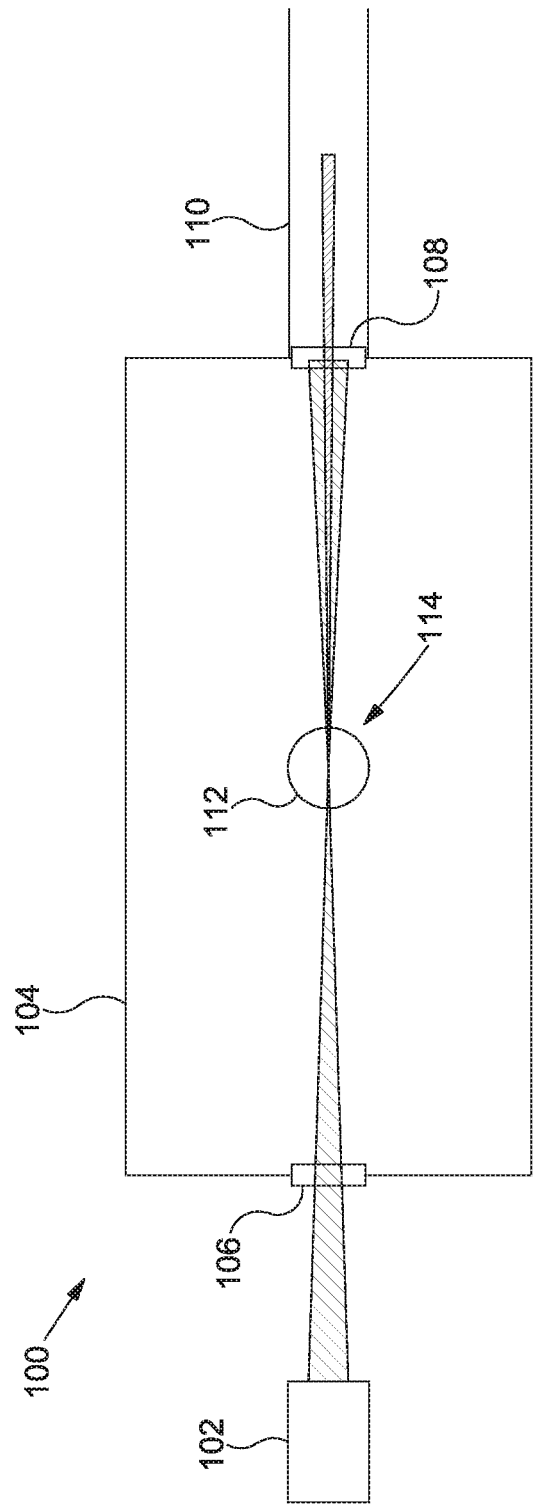
FIG. 1 is a schematic cross-sectional view of an apparatus for use as an HHG radiation source.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a support structure (e.g., a mask table) T constructed to support a patterning device (e.g., a mask) MA and connected to a first positioner PM configured to accurately position the patterning device MA in accordance with certain parameters, a substrate table (e.g., a wafer table) WT constructed to hold a substrate (e.g., a resist coated wafer) W and connected to a second positioner PW configured to accurately position the substrate in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illuminator IL receives a radiation beam from a radiation source SO, e.g. via a beam delivery system BD. The illumination system IL may include various types of optical components, such as refractive, reflective, magnetic, electromagnetic, electrostatic, or other types of optical components, or any combination thereof, for directing, shaping, or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system" PS.

The lithographic apparatus may be of a type wherein at least a portion of the substrate may be covered by a liquid having a relatively high refractive index, e.g., water, so as to fill a space between the projection system and the substrate—which is also referred to as immersion lithography. More information on immersion techniques is given in U.S. Pat. No. 6,952,253 and in PCT publication No. WO99-49504, which are incorporated herein by reference.

The lithographic apparatus LA may also be of a type having two (dual stage) or more substrate tables WT and, for example, two or more support structure T (not shown). In such "multiple stage" machines the additional tables/structures may be used in parallel, or preparatory steps may be carried out on one or more tables while one or more other tables are being used for exposing the design layout of the patterning device MA onto the substrate W.

In operation, the radiation beam B is incident on the patterning device (e.g., mask MA), which is held on the support structure (e.g., mask table T), and is patterned by the patterning device MA. Having traversed the mask MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and possibly another position sensor (which is not explicitly depicted in FIG. 1) may be used to accurately position the mask MA with respect to the path of the radiation beam B. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks).

Lithographic Cell

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Holistic Lithography

Typically the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MT (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MT) to predict whether defects may be present due to e.g. sub-optimal processing (depicted in FIG. 3 by the arrow pointing "0" in the second scale SC2).

The metrology tool MT may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

The apparatus of FIG. 2, which may comprise the detector of FIG. 3, can be used in as the metrology tool MT shown in FIG. 8, and/or as the inspection apparatus described above.

Further embodiments are disclosed in the subsequent numbered clauses:

1. A detector for detecting diffracted radiation which has been diffracted by a regular structure;
   said detector comprising:
   a sensor for sensing at least a portion of said diffracted radiation, said sensor having a first region and a second region;
   a first coating configured to allow transmission of radiation with wavelengths within a first range of wavelengths; and
   a second coating configured to allow transmission of radiation with wavelengths within a second range of wavelengths;
   wherein said first coating coats said first region of said sensor, and said second coating coats said second region of said sensor, and wherein said first and second regions are different regions.

2. A detector according to clause 1, the sensor comprising the regular structure and wherein the sensor and the coatings are arranged relative to said regular structure so that a first portion of the diffracted radiation, with diffraction angles within a first range of angles, is incident upon said first coating; and a second portion of the diffracted radiation, with diffraction angles within a second range of angles, is incident upon said second coating.

3. A detector according to clause 1 or 2, wherein the first coating has a first transmission spectrum to transmit incident radiation with wavelengths substantially only within the first range of wavelengths, and the second coating has a second transmission spectrum to transmit incident radiation with wavelengths substantially only within the second range of wavelengths.

4. A detector according to clause 1, 2 or 3, wherein the first and second ranges of wavelengths are contained within the range of 0.1 nm to 120 nm.

5. A detector according to any preceding clause, wherein the first range of wavelengths is equal to, or contained within, the range 6 nm to 19 nm.

6. A detector according to any preceding clause, wherein the second range of wavelengths is equal to, or contained within, the range 20 nm to 70 nm.

7. A detector according to any preceding clause, wherein at least one of the coatings comprises Zirconium, Zr.

8. A detector according to any preceding clause, wherein at least one of the coatings comprises Aluminium, Al.

9. A detector according to any preceding clause, wherein the detector comprises a third coating, wherein the detector comprising the regular structure, and wherein the detector is arranged so that a third portion of the radiation emitted from the regular structure with diffraction angles within a third range of angles is incident upon the third coating.

10. A detector according to any preceding clause, wherein at least one of said coatings is a multi-layered structure comprising multiple stacked layers.

11. A detector according to clause 10, wherein at least two adjacent layers of the at least one of said coatings are distinguished from each other by at least one of density, stress, thickness and composition.

12. A detector according to clause 2, wherein all diffraction angles within the first range of angles are smaller than any diffraction angle within the second range of angles.

13. A detector according to any preceding clause, wherein the sensor is one of a CMOS sensor, a CCD sensor and a scintillator.

14. A method of detecting radiation, comprising the steps of:
   generating radiation;
   diffracting at least a portion of the radiation by a regular structure;
   filtering a first portion of the radiation diffracted by the regular structure with diffraction angles within a first range of angles through a first coating;
   filtering a second portion of the radiation diffracted by the regular structure with diffraction angles within a second range of angles through a second coating; and
   detecting the radiation filtered through the first and second coatings.

15. A method according to clause 14, wherein the step of generating radiation comprises Higher Harmonic Generation, HHG.

16. A method according to clause 14, wherein the step of generating radiation is performed with one of a Laser-Produced Plasma, LPP, source, a Discharge Produced Plasma, DPP, source, and a synchrotron.

17. A method according to clauses 14, 15 or 16, wherein the regular structure is one of a diffraction grating and a patterned substrate.

18. A method according to anyone of clauses 14 to 17, wherein the at least a portion of the radiation substantially only comprises radiation diffracted by the regular structure with a zeroth diffraction order.

19. A method according to clause 17 or 18 and comprising the step of analysing detected radiation in order to determine one or more parameters of the patterned substrate.

20. A method according to clause 19 wherein the step of analysing involves comparing a frequency spectrum of the detected radiation to one or more spectra contained in a database.

21. A method according to clause 19 or 20, wherein the parameters comprise at least one of critical dimension, CD, and overlay, OVL.

22. A method according to any one of clauses 14 to 21, which is performed using a detector as defined in any one of clauses 1 to 13.

23. A spectrometer, comprising:
a detector as defined in any one of clauses 1 to 13; and
a diffraction grating configured to diffract at least a portion of said radiation towards the detector.

24. A spectrometer according to clause 23, wherein the diffraction grating is designed to have a specific diffraction efficiency.

25. A metrology apparatus for evaluating one or more parameters of an area of interest on a substrate, said metrology apparatus comprising:
a radiation source for generating a beam of radiation;
a substrate holder for holding the substrate, and arranged so that when holding the substrate at least a portion of the beam of radiation is incident upon the area of interest so as to diffract the beam of radiation;
a first spectrometer as defined in clause 23 for measuring a first spectrum, and positioned so that a zeroth diffraction order of the diffracted beam of radiation is incident upon said first spectrometer;
a processor for determining said one or more parameters of the area of interest by using the first spectrum.

26. A metrology apparatus according to clause 25, further comprising a second spectrometer as defined in clause 23 for measuring a second spectrum, and positioned so that the beam of radiation is incident upon it before said beam of radiation is incident upon the area of interest.

27. A metrology apparatus according to clause 25 or 26, further comprising at least one higher order detector for detecting at least one diffraction order of the beam of radiation diffracted from the area of interest on the substrate.

28. A metrology apparatus according to clause 27, wherein the at least one higher order detector is a detector as defined in any one of clauses 1 to 13.

29. A metrology apparatus according to clause 27 or 28, wherein the at least one higher order detector is configured to measure one or more characteristics of radiation incident upon it.

30. A metrology apparatus according to clause 29, wherein said one or more characteristics include wavelength, intensity and spatial distribution.

In the context of the above document the term HHG or HHG source is introduced. HHG refers to High Harmonic Generation or sometimes referred to as high order harmonic generation. HHG is a non-linear process in which a target, for example a gas, a plasma or a solid sample, is illuminated by an intensive laser pulse. Subsequently, the target may emit radiation with a frequency that is a multiple of the frequency of the radiation of the laser pulse. Such frequency, that is a multiple, is called a harmonic of the radiation of the laser pulse. One may define that the generated HHG radiation is a harmonic above the fifth harmonic and these harmonics are termed high harmonics. The physical process that forms a basis of the HHG process is different from the physical process that relates to generating radiation of the lower harmonics, typically the 2nd to 5th harmonic. The generation of radiation of the lower harmonic relates to perturbation theory. The trajectory of the (bound) electron of an atom in the target is substantially determined by the Coulomb potential of the host ion. In HHG, the trajectory of the electron that contributes to the HHG process is substantially determined by the electric field of the incoming laser light. In the so-called "three step model" describing HHG, electrons tunnel through the Coulomb barrier which is at that moment substantially suppressed by the laser field (step 1), follow a trajectory determined by the laser field (step 2) and recombine with a certain probability while releasing their kinetic energy plus the ionization energy in the form of radiation (step 3). Another way of phrasing a difference between HHG and the generation of radiation of the lower harmonic is to define that all radiation with photon energy above the ionization energy of the target atoms as "High Harmonic" radiation, e.g. HHG generated radiation, and all radiation with photon energy below the ionization energy as non-HHG generated radiation. If Neon is used as a gas target, all radiation with a wavelength shorter than 62 nm (having a photon energy higher than 20.18 eV) is generated by means of the HHG process. For Argon as a gas target, all radiation having a photon energy higher than about 15.8 eV is generated by means of the HHG process.

Although specific reference is made in this text to "metrology apparatus" or "inspection apparatus", both terms may also refer to an inspection apparatus or an inspection system. E.g. the inspection or metrology apparatus that comprises an embodiment of the invention may be used to determine characteristics of structures on a substrate or on a wafer. E.g. the inspection apparatus or metrology apparatus that comprises an embodiment of the invention may be used to detect defects of a substrate or defects of structures on a substrate or on a wafer. In such an embodiment, a characteristic of interest of the structure on the substrate may relate to defects in the structure, the absence of a specific part of the structure, or the presence of an unwanted structure on the substrate or on the wafer.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), and thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

Each feature disclosed or illustrated in the present specification may be incorporated in the invention, whether alone or in any appropriate combination with any other feature disclosed or illustrated herein.

The invention claimed is:

1. A detector for detecting broadband diffracted radiation in a range of 0.1-120 nm that has been diffracted by a regular structure, the detector comprising:
    a sensor configured to sense at least a portion of the diffracted radiation in the range, the sensor having a first region and a second region;
    a first coating disposed on the first region of the sensor and configured to allow transmission of radiation to the sensor with wavelengths within a first subrange of the range of wavelengths; and
    a second coating disposed on the second region of the sensor and configured to allow transmission of radiation to the sensor with wavelengths within a second subrange of the range of wavelengths;
    wherein the first coating coats the first region of the sensor, and the second coating coats the second region of the sensor, and wherein the first and second regions are different regions; and
    wherein the sensor and the coatings are arranged relative to the regular structure so that:
        a first portion of the diffracted radiation, with diffraction angles within a first range of angles, is incident upon the first coating; and
        a second portion of the diffracted radiation, with diffraction angles within a second range of angles, is incident upon the second coating.

2. The detector of claim 1, wherein the first coating has a first transmission spectrum to transmit incident radiation with wavelengths substantially only within the first range of wavelengths, and the second coating has a second transmission spectrum to transmit incident radiation with wavelengths substantially only within the second range of wavelengths.

3. The detector of claim 1, wherein at least one of:
    the first and second ranges of wavelengths are contained within the range of 0.1 nm to 120 nm, or
    the first range of wavelengths is equal to, or contained within, the range of 6 nm to 19 nm.

4. The detector of claim 1, wherein at least one of the coatings comprises zirconium and at least one of the coatings comprises aluminum.

5. The detector of claim 1, wherein:
    the detector comprises a third region having a third coating disposed thereon, and
    the detector is arranged so that a third portion of the radiation emitted from the regular structure with diffraction angles within a third range of angles is incident upon the third coating.

6. The detector of claim 1, wherein at least one of the coatings is a multi-layered structure comprising multiple stacked layers.

7. The detector of claim 6, wherein at least two adjacent layers of the at least one of the coatings are distinguished from each other by at least one of density, stress, thickness or composition.

8. The detector of claim 1, wherein all diffraction angles within the first range of angles are smaller than any diffraction angle within the second range of angles.

9. The detector of claim 1, wherein the sensor is one of a CMOS sensor, a CCD sensor and a scintillator.

10. A method of detecting broadband radiation in a range of 0.1-120 nm, comprising:
    generating radiation;
    diffracting at least a portion of the radiation in the range by a regular structure to be sensed by a sensor;
    filtering a first portion of the radiation diffracted by the regular structure and transmitting part of the first portion of the radiation to the sensor with wavelengths within a first subrange of the range of wavelengths through a first coating disposed on the first region of a sensor;
    filtering a second portion of the radiation diffracted by the regular structure and transmitting part of the second portion of the radiation to the sensor with wavelengths within a second subrange of the range of wavelengths through a second coating disposed on the second region of the sensor;
    wherein the first and second regions are different regions of the sensor;
    detecting the radiation filtered through the first and second coatings; and
    arranging the sensor and the coatings relative to the regular structure so that:
        a first portion of the diffracted radiation, with diffraction angles within a first range of angles, is incident upon the first coating; and
        a second portion of the diffracted radiation, with diffraction angles within a second range of angles, is incident upon the second coating.

11. The method of claim 10, wherein the generating radiation comprises Higher Harmonic Generation.

12. The method of claim 10, wherein the regular structure is a diffraction grating or a patterned substrate, and the at least a portion of the radiation substantially only comprises radiation diffracted by the regular structure with a zeroth diffraction order.

13. The method of claim 12, further comprising analyzing detected radiation to determine one or more parameters of the patterned substrate.

14. The method of claim 13, wherein the analyzing comprises comparing a frequency spectrum of the detected radiation to one or more spectra contained in a database.

15. The method of claim 13, wherein the determining one or more parameters comprises determining one or more of critical dimension, CD, overlay, and OVL.

16. A spectrometer, comprising:
    a detector configured to detect broadband diffracted radiation in a range of 0.1-120 nm that has been diffracted by a regular structure, comprising:

a sensor configured to sense at least a portion of the diffracted radiation, the sensor having a first region and a second region;

a first coating configured to allow transmission of radiation to the sensor with wavelengths within a first subrange of the range of wavelengths; and a second coating configured to allow transmission of radiation to the sensor with wavelengths within a second subrange of the range of wavelengths;

wherein the first coating coats the first region of the sensor, and the second coating coats the second region of the sensor, and wherein the first and second regions are different regions; and a diffraction grating configured to diffract at least a portion of the radiation towards the detector;

wherein the sensor and the coatings are arranged relative to the regular structure so that:

a first portion of the diffracted radiation, with diffraction angles within a first range of angles, is incident upon the first coating; and a second portion of the diffracted radiation, with diffraction angles within a second range of angles, is incident upon the second coating.

17. The spectrometer of claim 16, wherein the diffraction grating is configured to have a specific diffraction efficiency.

18. A metrology apparatus for evaluating one or more parameters of an area of interest on a substrate, the metrology apparatus comprising:

a radiation source for generating a beam of radiation;

a substrate holder for holding the substrate, and arranged so that when holding the substrate at least a portion of the beam of radiation is incident upon the area of interest so as to diffract the beam of radiation;

a first spectrometer as defined in claim 16, for measuring a first spectrum, and positioned so that a zeroth diffraction order of the diffracted beam of radiation is incident upon the first spectrometer; and a processor for determining the one or more parameters of the area of interest by using the first spectrum.

19. The detector of claim 1, wherein the first region and the second region are co-planar.

20. The detector of claim 19, wherein the first region and the second region are integrated so as to form the sensor.

* * * * *